United States Patent
Kim et al.

(10) Patent No.: US 10,883,165 B2
(45) Date of Patent: Jan. 5, 2021

(54) MASK SHEET AND MANUFACTURING METHOD FOR THE SAME

(71) Applicant: Samsung Display Co., Ltd., Yongin-si (KR)

(72) Inventors: In-bae Kim, Daejeon (KR); Minho Moon, Anyang-si (KR); Sungsoon Im, Suwon-si (KR); Kyuhwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 16/169,693

(22) Filed: Oct. 24, 2018

(65) Prior Publication Data

US 2019/0177830 A1    Jun. 13, 2019

(30) Foreign Application Priority Data

Dec. 8, 2017    (KR) .......... 10-2017-0168682

(51) Int. Cl.
| | |
|---|---|
| *C21D 6/00* | (2006.01) |
| *C23C 14/04* | (2006.01) |
| *B23K 31/02* | (2006.01) |
| *B23K 26/06* | (2014.01) |
| *C22C 38/40* | (2006.01) |

(52) U.S. Cl.
CPC ........ *C23C 14/042* (2013.01); *B23K 26/0661* (2013.01); *B23K 31/02* (2013.01); *C21D 6/001* (2013.01); *C22C 38/40* (2013.01)

(58) Field of Classification Search
None
See application file for complete search history.

(56) References Cited

U.S. PATENT DOCUMENTS

| | | | | |
|---|---|---|---|---|
| 5,026,312 A | * | 6/1991 | Van Den Berg | ........ H01J 9/142 445/47 |
| 5,578,898 A | * | 11/1996 | Higashinakagawa | ... H01J 29/07 313/402 |
| 6,805,966 B1 | * | 10/2004 | Formato | ................ B82Y 10/00 101/34 |
| 9,828,665 B2 | | 11/2017 | Ikenaga et al. | |

(Continued)

FOREIGN PATENT DOCUMENTS

| | | |
|---|---|---|
| JP | 5441663 B2 | 3/2014 |
| KR | 10-1999-0046861 A | 7/1999 |

(Continued)

OTHER PUBLICATIONS

Nagayama et al., Thermal expansions and mechanical properties of electrodeposited Fe—Ni alloys in the Invar composition range, Electrochimica Acta 205, 2016, 178-187.

*Primary Examiner* — George Wyszomierski
(74) *Attorney, Agent, or Firm* — Lewis Roca Rothgerber Christie LLP

(57) ABSTRACT

A mask sheet and a method for manufacturing the same are provided. A mask sheet includes one or more openings defined therein, and an alloy of nickel and iron, and a particle of the alloy has a single crystalline structure. A method for manufacturing a mask sheet includes preparing a base sheet including an alloy of nickel and iron, performing a heat treatment on the entire base sheet; and forming one or more openings in the heat-treated base sheet.

10 Claims, 10 Drawing Sheets

(56) References Cited

U.S. PATENT DOCUMENTS

| | | | | |
|---|---|---|---|---|
| 2014/0312546 A1* | 10/2014 | Lee | ............... | B23K 37/0408 |
| | | | | 269/8 |
| 2017/0198383 A1 | 7/2017 | Chang et al. | | |
| 2019/0259950 A1* | 8/2019 | Jung | ............... | H01L 51/0011 |

FOREIGN PATENT DOCUMENTS

| | | |
|---|---|---|
| KR | 10-2017-0084738 A | 7/2017 |
| KR | 10-2017-0086701 A | 7/2017 |

* cited by examiner

MASK SHEET AND MANUFACTURING METHOD FOR THE SAME

CROSS-REFERENCE TO RELATED APPLICATION

This application claims priority to and the benefit of Korean Patent Application No. 10-2017-0168682, filed on Dec. 8, 2017 in the Korean Intellectual Property Office, the entire content of which is hereby incorporated by reference.

BACKGROUND

1. Field

Aspects of embodiments of the present disclosure relate to a mask sheet and a manufacturing method for the same.

2. Description of the Related Art

As display devices having high resolution and low power consumption are required or desired, various display devices such as liquid display devices and organic electroluminescence display devices are being developed. The organic electroluminescence display devices have attracted considerable attention as next-generation display devices because of their excellent characteristics such as low power consumption, a fast response time, and a wide viewing angle. When an organic thin film layer is deposited for manufacturing the organic electroluminescence display devices, a mask sheet is generally used. This mask sheet is important in that it has an effect on the grade and the overall yields of the organic electroluminescence display devices.

Recently, with the demands for high resolution in the display devices, the development of a high-quality mask sheet having a thin thickness and capable of minimizing or reducing process variation has been required.

SUMMARY

According to an aspect of embodiments of the present disclosure, a mask sheet that enables the production of a display device having high resolution, and a manufacturing method for the same are provided. According to an aspect of embodiments of the present disclosure, a mask sheet that may be used in thin film deposition and a manufacturing method for the same are provided.

According to one or more embodiments of the present disclosure, a mask sheet includes: one or more openings defined therein; and an alloy of nickel and iron, wherein a particle of the alloy has a single crystalline structure.

In an embodiment, the single crystalline structure may have only a face centered cubic (FCC) structure.

In an embodiment, a content of the nickel in the alloy may be in a range from about 33 wt % to about 37 wt %.

In an embodiment, a size of the particle in the alloy may be in micro-scale.

In an embodiment, a coefficient of thermal expansion (CTE) of the mask sheet is about 1 ppm/° C. or less.

In an embodiment, the mask sheet may have a thickness of about 30 μm or less.

In an embodiment, the mask sheet may include: a pattern portion in which the one or more openings are defined; and a weld portion connected to the pattern portion, wherein an average thickness of the pattern portion is less than an average thickness of the weld portion.

In an embodiment, particles of both the pattern portion and the weld portion may have single crystalline structures.

In an embodiment, particle sizes of both the pattern portion and the weld portion may be in micro-scale.

According to one or more embodiments of the present disclosure, a method for manufacturing a mask sheet includes: preparing a base sheet including an alloy of nickel and iron; performing a heat treatment on the entire base sheet; and forming one or more openings in the heat-treated base sheet. In an embodiment, the heat treatment may be performed on the entire base sheet.

In an embodiment, the heat treatment may be performed under a nitrogen and hydrogen atmosphere, and a ratio of the nitrogen and the hydrogen may be about 95:5 to about 99:1.

In an embodiment, the heat treatment may be performed at a temperature in a range from about 520° C. to about 580° C. for about one hour to about two hours.

In an embodiment, the preparing of the base sheet may include preparing a base sheet in which a content of the nickel in the alloy of nickel and iron is in a range from about 33 wt % to about 37 wt %.

In an embodiment, the preparing of the base sheet may include forming the base sheet by electroforming.

In an embodiment, the forming of the one or more openings may be performed by laser radiation.

In an embodiment, the preparing of the base sheet may include preparing a base sheet having a thickness of about 30 μm or less.

In an embodiment, the preparing of the base sheet may include preparing a base sheet in which a particle of the alloy has a polycrystalline structure.

In an embodiment, a particle of the alloy in the heat-treated base sheet after the heat treatment may have a single crystalline structure. In an embodiment, the single crystalline structure may have only a face centered cubic (FCC) structure.

In an embodiment, a size of the particle in the heat-treated base sheet after the heat treatment may be in micro-scale.

BRIEF DESCRIPTION OF THE FIGURES

The accompanying drawings are included to provide a further understanding of the present disclosure, and are incorporated in and constitute a part of this specification. The drawings illustrate some exemplary embodiments of the present disclosure and, together with the description, serve to explain principles of the present disclosure. In the drawings.

DETAILED DESCRIPTION

Figure 1:
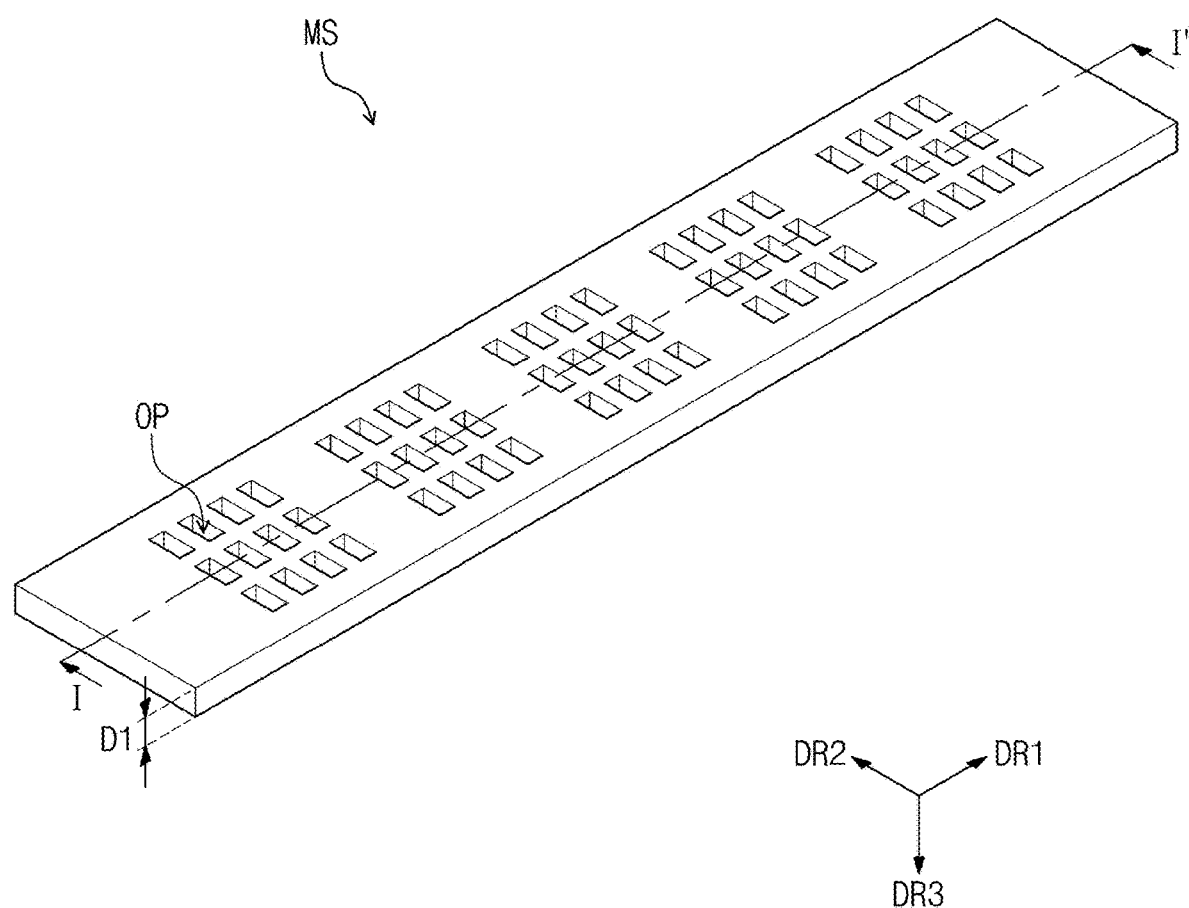
FIG. 1 is a perspective view of a mask sheet according to an embodiment of the present disclosure.

The above aspects, other aspects, features, and advantages of the present disclosure will be better understood with reference to the following description of some exemplary embodiments and the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

When explaining each of the drawings, like reference numerals are used for referring to same or similar elements. In the accompanying drawings, the dimensions of each structure may be shown exaggerated for clarity of the present disclosure. Although terms such as "first" and "second" may be used herein to describe various elements, these elements should not be limited by these terms. The terms are used to distinguish one element from other elements. For example, a "first" element can be referred to as a "second" element, and similarly a "second" element can be referred to as a "first" element without departing from the scope of the present disclosure. The expression of a singular form may include plural forms unless definitely indicating a particular case in terms of the context.

In the present application, it is to be understood that the meaning of "comprise" or "have" specifies the presence of a feature, a fixed number, a step, a process, an element, a component, or a combination thereof disclosed in the specification, but does not exclude the possibility of presence or addition of one or more other features, fixed numbers, steps, processes, elements, components, or combinations thereof. Also, when a layer, a film, a region, or a plate is referred to as being "above" or "in an upper portion of" another layer, film, region, or plate, it may be "directly on" the layer, film, region, or plate, or one or more intervening layers, films, regions, or plates may also be present. Also, it is to be understood that when a layer, a film, a region, or a plate is referred to as being "under" another layer, film, region, or plate, it may be "directly under" the layer, film, region, or plate, or one or more intervening layers, films, regions, or plates may also be present.

First, a mask sheet according to an embodiment of the present disclosure will be described with reference to the drawings.

FIG. 1 is a perspective view of a mask sheet according to an embodiment of the present disclosure.

The top surfaces of components are parallel to a surface defined by a first directional axis DR1 and a second directional axis DR2. The thickness directions of components are indicated by a third directional axis DR3. The upper side (or upper portion) and the lower side (or lower portion) of the components are distinguished from each other by the third directional axis DR3. However, directions indicated as the first to third directional axes DR1, DR2, and DR3 may be a relative concept and thus be changed to other directions. Herein, first to third directions refer to the same reference symbols as the directions indicated by the first to third directional axes DR1, DR2, and DR3, respectively.

Referring to FIG. 1, in a mask sheet MS according to an embodiment of the present disclosure, one or more openings OP are defined. The one or more openings OP may be disposed or defined spaced apart from each other in a first direction DR1 and/or a second direction DR2, and may provide a certain pattern.

The mask sheet MS includes an alloy of nickel and iron. For example, the mask sheet MS may be formed of the alloy of nickel and iron. The mask sheet MS may include Invar, but embodiments of the present disclosure are not limited thereto.

The main material of the mask sheet MS, i.e. the alloy of nickel and iron, has a particle having a single crystalline structure. For example, the particle in the alloy of nickel and iron, which is the main material of the mask sheet MS, may have only a face centered cubic (FCC) structure, but may not have a body centered cubic (BCC) structure. Since the thermal conductivity of the particle having the FCC structure is higher than that of the particle having the BCC structure, the mask sheet MS according to an embodiment of the present disclosure has the FCC structure, and, thus, the welding characteristics may be improved. In addition, the heat treatment is required so as to include only the FCC structure, and this causes the reduction in the coefficient of thermal expansion of the mask sheet MS and, as a result, the expansion issue of the mask sheet MS may be also solved even during the repeated deposition processes.

In the alloy of nickel and iron, a content of the nickel may be in a range from about 33 wt % to about 37 wt %. In an exemplary embodiment, a content of the nickel in the alloy of nickel and iron may be about 36 wt %, but embodiments of the present disclosure are not limited thereto.

The particle size in the alloy of nickel and iron may be in micro-scale. Across the entire mask sheet MS, the particle sizes may be in micro-scale. When the particle size is in nano-scale, the thermal conductivity becomes low, and the amount of melting becomes larger during the local heating, such that a welding failure may be caused. When the mask sheet MS should be welded and fixed so as to perform a deposition process, the particle size is formed to be relatively larger than that in nano-scale, and, thus, it may be possible to solve the limitation that the welding becomes difficult due to the larger amount of welding.

As a high resolution may be required, the mask sheet MS needs to be thin, and as the thickness of the mask sheet MS becomes thinner, the influence of the thermal conductivity according to the particle size becomes significant.

For example, a thickness D1 of the mask sheet MS according to an embodiment of the present disclosure may be about 30 μm or less. In order to realize the thickness of about 30 μm or less, the mask sheet MS may be formed by means of electroforming of a base sheet made of the alloy of nickel and iron. A method for manufacturing the mask sheet MS according to an embodiment of the present disclosure will be described later.

In an embodiment, a thickness D1 of the mask sheet MS may be about 25 μm or less and, in an embodiment, 20 μm or less. The thickness D1 of the mask sheet MS means a thickness of a region in which the openings OP are not defined and, for example, means a thickness in a third direction DR3. The thickness D1 of the mask sheet MS may mean an average thickness.

In order to realize high resolution, it is advantageous that the thickness D1 of the mask sheet MS is reduced, but a certain thickness (e.g., a predetermined thickness) or more is needed to ensure durability. In an embodiment, the thickness D1 of the mask sheet MS may be about 1 μm or more and, in an embodiment, about 5 μm or more, but embodiments of the present disclosure are not limited thereto.

In an embodiment, the coefficient of thermal expansion of the mask sheet MS may be about 1 ppm/° C. or less. For example, the coefficient of thermal expansion of the mask sheet MS may be about 0.1 ppm/° C. to about 0.8 ppm/° C. In a case in which the coefficient of thermal expansion of the mask sheet MS exceeds about 1 ppm/° C., when deposition processes are repeatedly performed using the mask sheet MS, the mask sheet MS may expand, causing the failure that the deposition is not performed at an exact target position. That is, when the thickness is about 30 μm or less and the coefficient of thermal expansion is about 1 ppm/° C. or less in the mask sheet MS, a deposition material may be deposited having an accurate and precise pattern, and this may be realized by the particle of the mask sheet MS having the single crystalline structure and, more particularly, the FCC structure.

Figure 2:
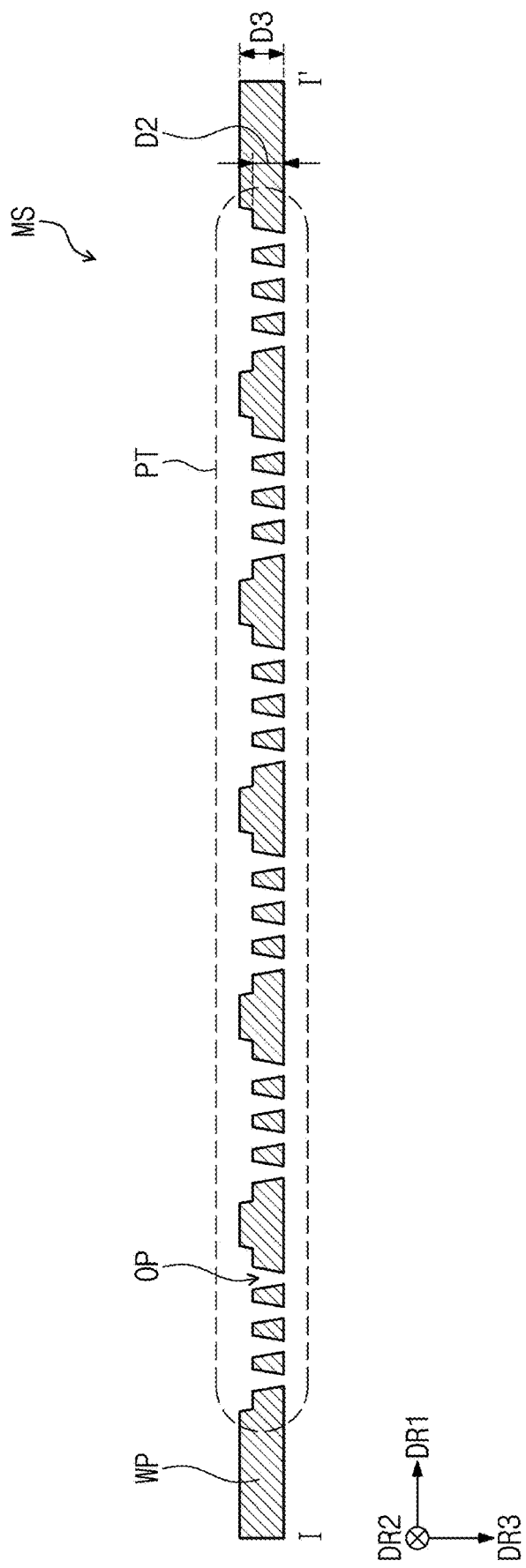
FIG. 2 is a cross-sectional view taken along the line I-I' of FIG. 1, according to an embodiment of the present disclosure.

FIG. 2 is a cross-sectional view taken along the line I-I' of FIG. 1, according to an embodiment of the present disclosure.

Referring to FIG. 2, the mask sheet MS according to an embodiment of the present disclosure may have a pattern portion PT and a weld portion WP. In the pattern portion PT, one or more openings OP are defined. In an embodiment, the openings OP may be defined over the entire pattern portion PT. For another example, the one or more openings OP defined in the pattern portion PT may be defined in the form of a plurality of groups. The pattern portion PT may correspond to a display part of a display device manufactured by the mask sheet MS.

The weld portion WP is connected to the pattern portion PT and does not have the openings OP. In an embodiment, the weld portion WP and the pattern portion PT may be integrated into a single body. The weld portion WP may be formed in a portion of the mask sheet MS, for example, in a region except for the pattern portion PT. The weld portion WP may be disposed at each of both ends of the pattern portion PT and connected to the pattern portion PT, but embodiments of the present disclosure are not limited thereto.

The pattern portion PT and the weld portion WP may be made of the same material. For example, both the pattern portion PT and the weld portion WP may include the alloy of nickel and iron. An average thickness D2 of the pattern portion PT may be smaller than an average thickness D3 of the weld portion WP. As previously described, one or more openings OP are defined in the pattern portion PT, and, in an embodiment, the openings OP may be defined using a laser drilling method. When irradiated by the laser, the thickness in a region around the openings OP becomes slightly reduced, and, thus, the average thickness D2 of the pattern portion PT may be formed to be smaller than the average thickness D3 of the weld portion WP in which the openings OP are not defined.

When the thickness is small, the control of the coefficient of thermal expansion in the pattern portion PT becomes relatively important because it is more susceptible to expansion caused by the low coefficient of thermal expansion. Also, the average thickness D3 of the weld portion WP becomes reduced together as the average thickness D2 of the pattern portion PT integrally formed therewith is reduced, and the control of the particle size in the weld portion WP becomes relatively important because it is more susceptible to the large amount of welding during the welding. Therefore, in the mask sheet MS according to an embodiment of the present disclosure, the sizes of particles may be in micro-scale size over the entire mask sheet MS regardless of the pattern portion PT and the weld portion WP, and the particles may have the single crystalline structures. More particularly, both the particle of the pattern portion PT and the particle of the weld portion WP may have a crystal structure having only the face centered cubic (FCC) structure, and both the particle size of the pattern portion PT and the particle size of the weld portion WP may be in microscale.

Figure 3:
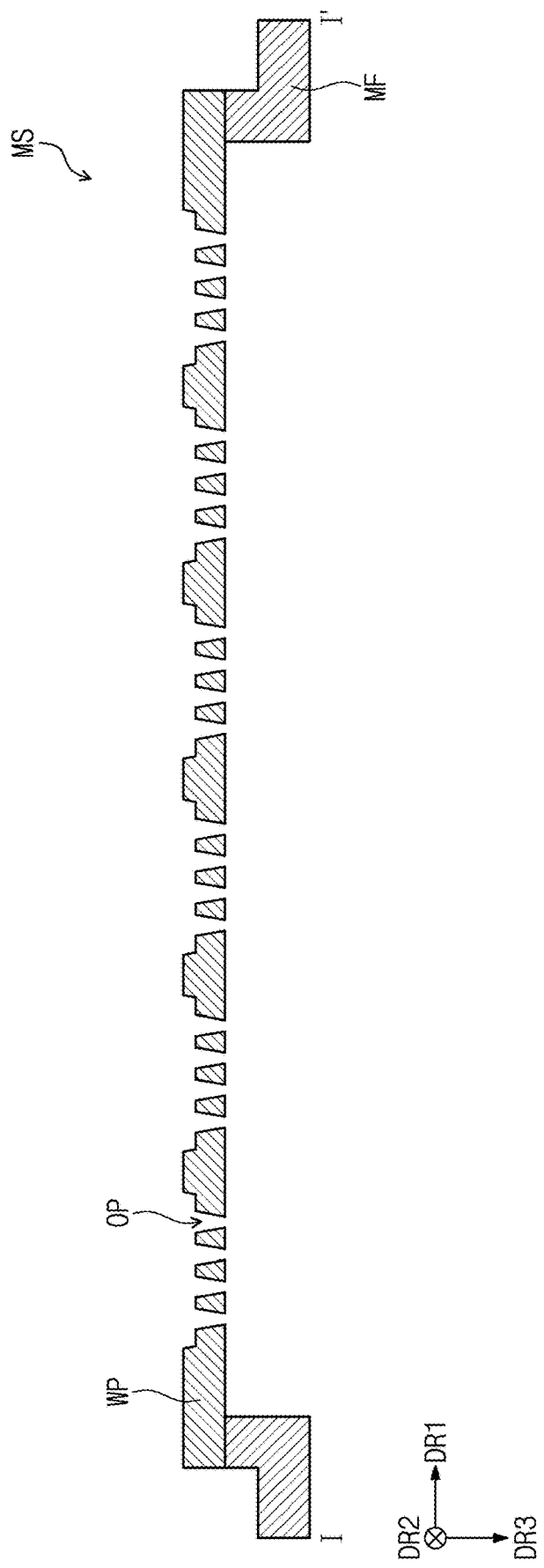
FIG. 3 is a cross-sectional view taken along the line I-I' of FIG. 1, according to an embodiment of the present disclosure.

FIG. 3 is a cross-sectional view taken along line I-I' of FIG. 1, according to an embodiment of the present disclosure.

Referring to FIG. 3, a mask sheet MS may be fixed to a mask frame MF. For example, the mask sheet MS may be fixed to the mask frame MF in a tensioned state. That is, while being tensioned in a first direction DR1, the mask sheet MS may be fixed to the mask frame MF by welding a weld portion WP. In an embodiment, although not shown, a plurality of mask sheets MS may be spaced apart from each other at a certain distance and fixed to the mask frame MF.

In an embodiment, although not illustrated, a supporting member is disposed in the mask frame MF, and the supporting member may support the mask sheet MS and thus prevent or substantially prevent deflection thereof.

Figure 4:
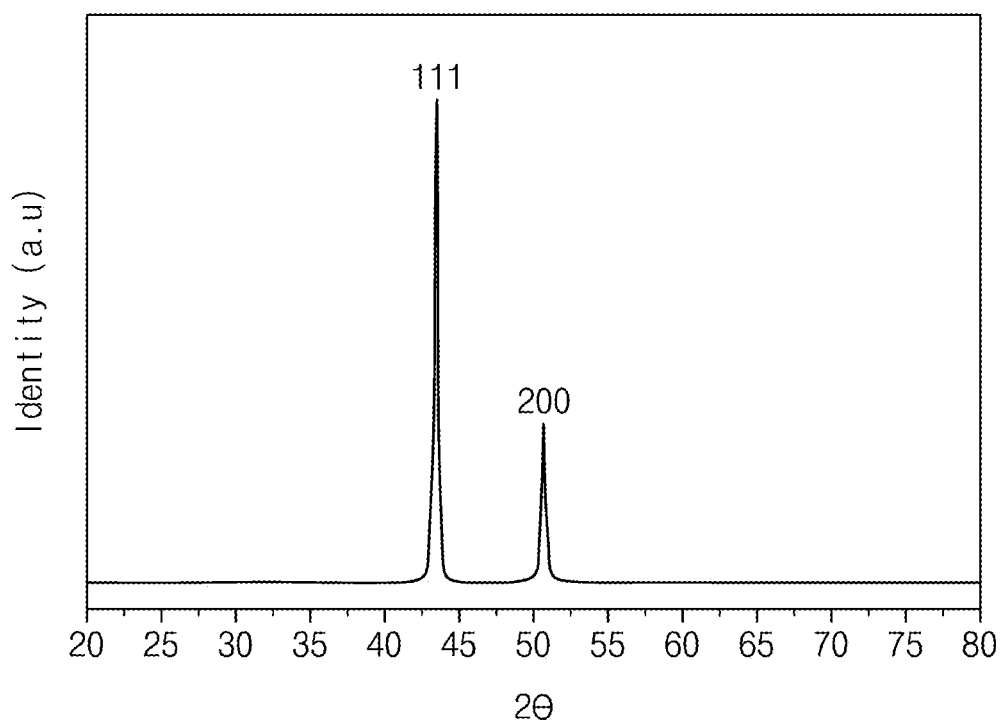
FIG. 4 shows XRD analysis results obtained from analyzing a crystal structure of a particle of an alloy included in a mask sheet according to an embodiment of the present disclosure.

FIG. 4 shows XRD analysis results obtained from analyzing a crystal structure of a particle of an alloy included in a mask sheet according to an embodiment of the present disclosure.

Referring to the results of FIG. 4, XRD analysis result shows a 111 peak and 200 peak. From this result, it may be confirmed that a mask sheet MS according to an embodiment of the present disclosure has the particle having only the FCC structure.

The mask sheet MS according to an embodiment of the present disclosure has an alloy of nickel and iron, and a particle in the alloy has a single crystalline structure having only the FCC structure such that the coefficient of thermal expansion becomes decreased and the particle size becomes relatively increased. As a result, the welding characteristics of the mask sheet MS are improved, and expansion of the mask sheet MS may be minimized or reduced, even when deposition processes are repeated, thereby enabling accurate and precise pattern deposition.

Herein, a method for manufacturing the mask sheet MS will be described in further detail. Herein, differences with respect to the mask sheet MS according to the foregoing embodiment of the present disclosure will be mainly described, and non-explained portions will refer to the foregoing descriptions. The same or similar components are provided with the same reference numerals, and duplicate descriptions thereof will be omitted.

Figure 5:
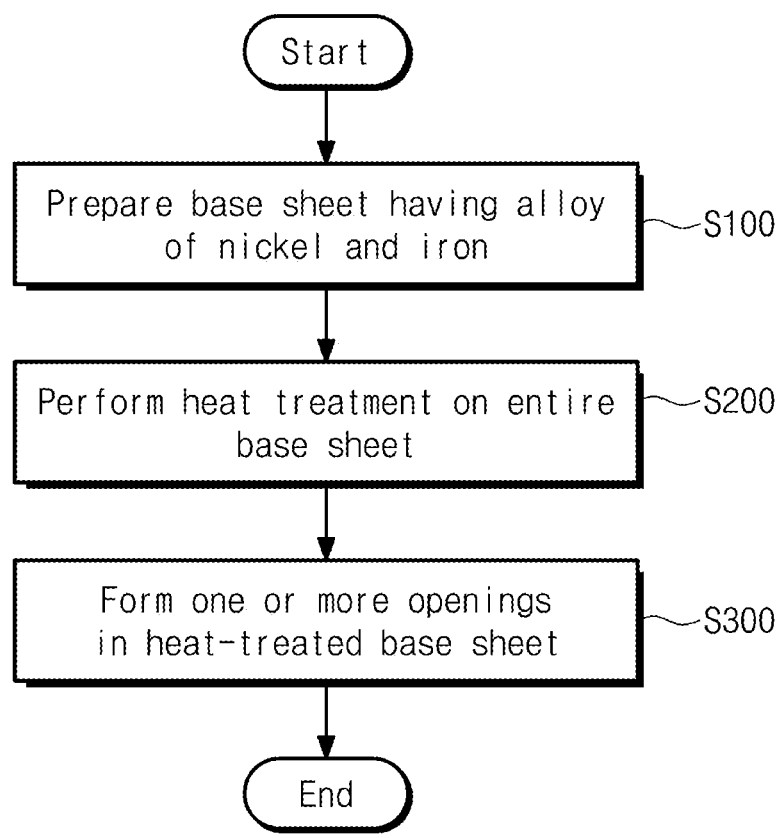
FIG. 5 is a schematic flowchart of a method for manufacturing a mask sheet according to an embodiment of the present disclosure.
Figure 6:
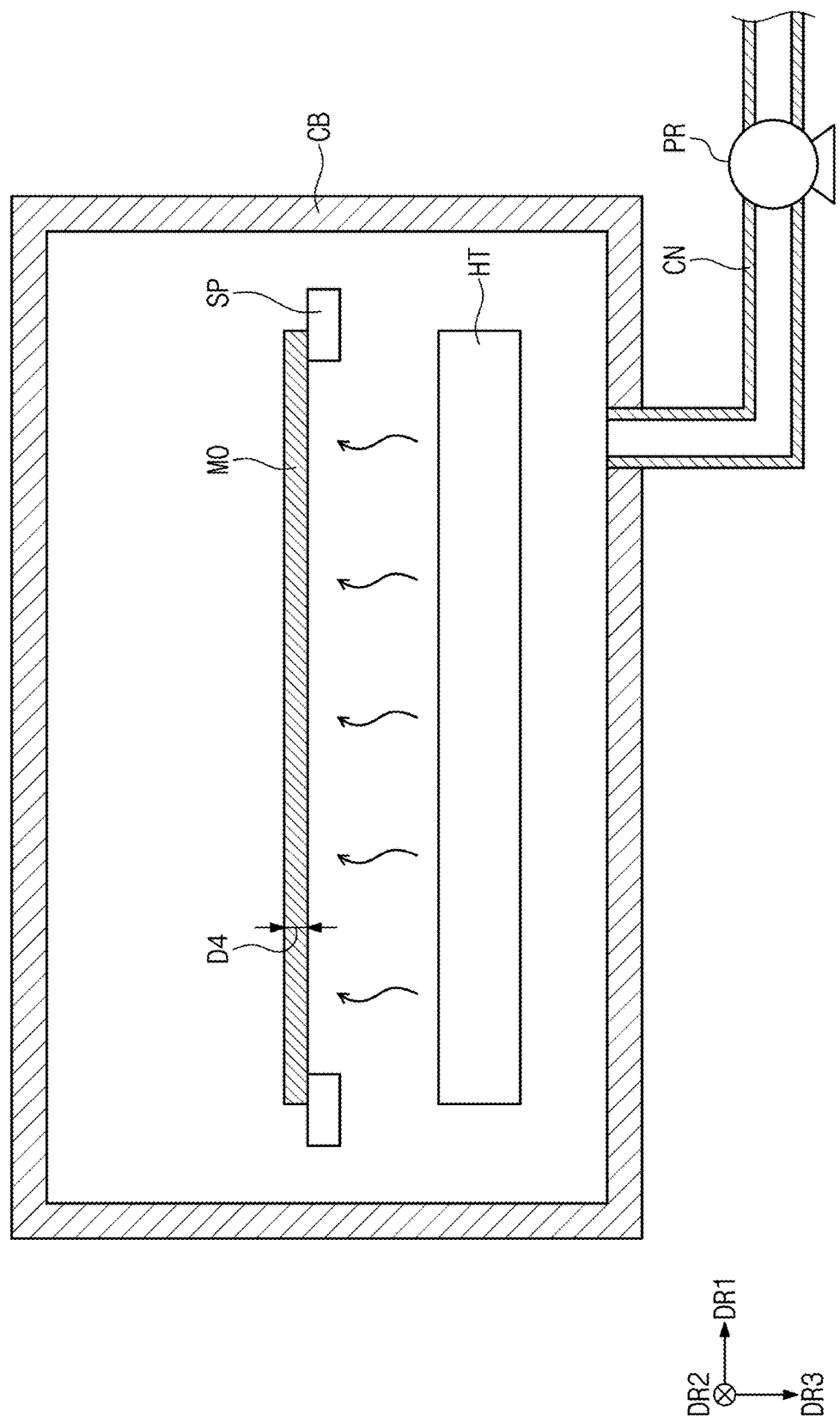
FIG. 6 is a view to describe a process of heat treatment, the process being included in a method for manufacturing a mask sheet according to an embodiment of the present disclosure.
Figure 7:
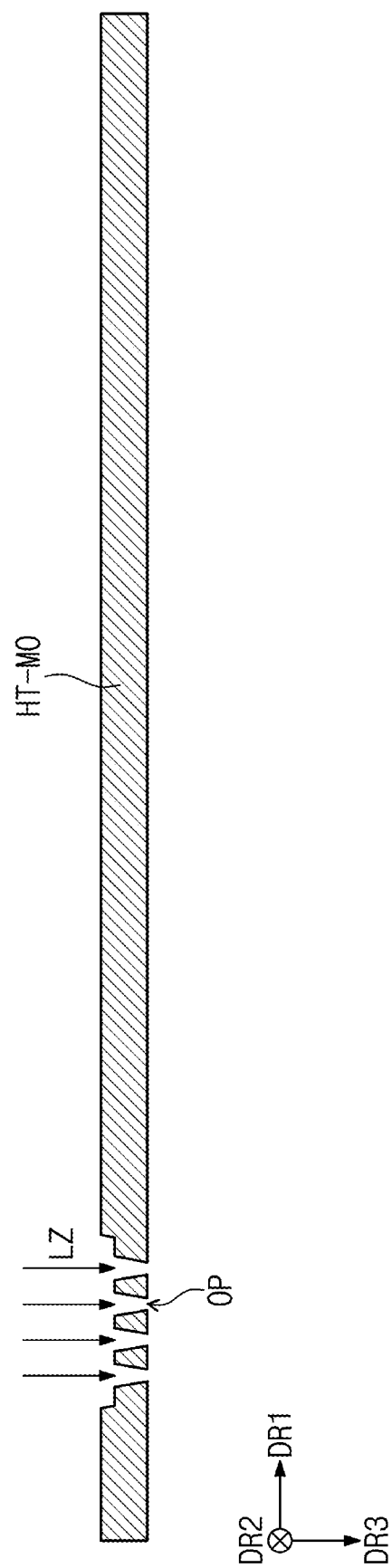
FIG. 7 is a view schematically showing a process of forming an opening, the process being included in a method for manufacturing a mask sheet according to an embodiment of the present disclosure.

FIG. 5 is a schematic flowchart of a method for manufacturing a mask sheet according to an embodiment of the present disclosure. FIG. 6 is a view to describe a process of heat treatment, the process being included in a method for manufacturing a mask sheet according to an embodiment of the present disclosure. FIG. 7 is a view schematically showing a process of forming an opening, the process being included in a method for manufacturing a mask sheet according to an embodiment of the present disclosure.

Referring to FIGS. 5 to 7, a method for manufacturing the mask sheet according to an embodiment of the present disclosure includes a process (S100) of preparing a base sheet MO, a process (S200) of performing a heat treatment on the entire base sheet MO, and a process (S300) of forming one or more openings OP in a heat-treated base sheet HT-MO.

The process (S100) of preparing the base sheet MO is the preparation of the base sheet MO having an alloy of nickel and iron, and the base sheet MO may be made of the alloy of nickel and iron.

In an embodiment, a thickness D4 of the base sheet MO may be about 30 μm or less and, in an embodiment, about 25 μm or less. In an embodiment, in order to prepare the thin film-shaped base sheet MO having a thickness of about 30 μm or less, the base sheet MO may be formed by electroforming. That is, the process (S100) of preparing the base sheet MO may include a process of forming the base sheet MO by the electroforming process. When the base sheet is formed by the rolling process, there is a limitation to realize a thin film shape, and, thus, the manufacturing method according to an embodiment of the present disclosure includes the process (S100) of preparing the base sheet MO using the electroforming.

The process (S100) of preparing the base sheet MO may be the purchase of the commercial base sheet MO having the alloy of nickel and iron.

In an embodiment, the particle in the alloy of nickel and iron which are main materials of the base sheet MO may have a polycrystalline structure. For example, the particle in the alloy of nickel and iron which are main materials of the base sheet MO may have both a BCC structure and an FCC structure. Alternatively, for example, the particle may have a single crystalline structure having only the BCC structure.

The particle size in the alloy of the base sheet MO may be in nano-scale.

When the base sheet MO is prepared, then the process (S200) of performing the heat treatment on the entire base sheet MO is carried out. The process (S200) of performing the heat treatment may be carried out by seating the base sheet MO to the inside of a chamber CB and operating a heating part HT disposed inside the chamber CB. The heating part HT may be a laser radiation device or the like, but embodiments of the present disclosure are not limited thereto. The base sheet MO may be seated and fixed to a supporting part SP in the chamber CB.

In an embodiment, the process (S200) of performing the heat treatment may be carried out under a nitrogen and hydrogen atmosphere. That is, the process (S200) of performing the heat treatment may be a process of heating the base sheet MO by applying a laser or the like thereto while supplying a nitrogen gas and a hydrogen gas to the inside of the chamber CB, and may be a process of performing the heat treatment on the entire surface of the base sheet MO.

In an embodiment, the process (S200) of performing the heat treatment may be carried out under a vacuum condition or a low vacuum condition of about 5 torr or less. A pressure regulating part PR is connected to the chamber CB and may discharge the gas inside the chamber CB to the outside. The pressure regulating part PR may be connected to the chamber CB via a connecting conduit CN. The pressure inside the chamber CB may be maintained, for example, in a vacuum state by using the pressure regulating part PR.

Figure 8A:
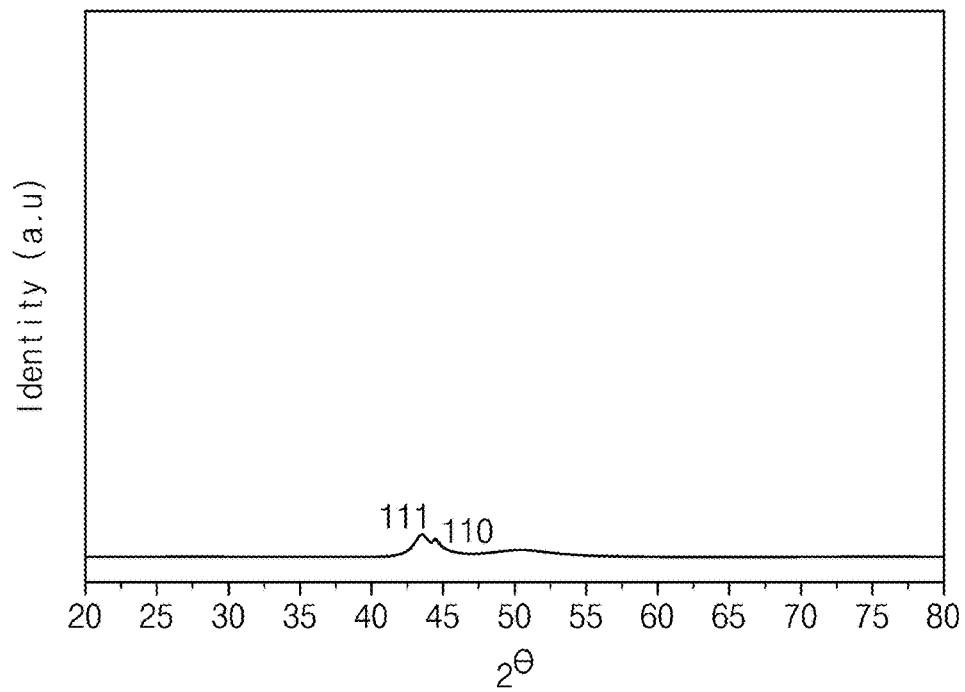
FIG. 8A shows XRD analysis results obtained from analyzing a crystal structure of a particle of an alloy included in a mask sheet before a process of heat treatment.
Figure 8B:
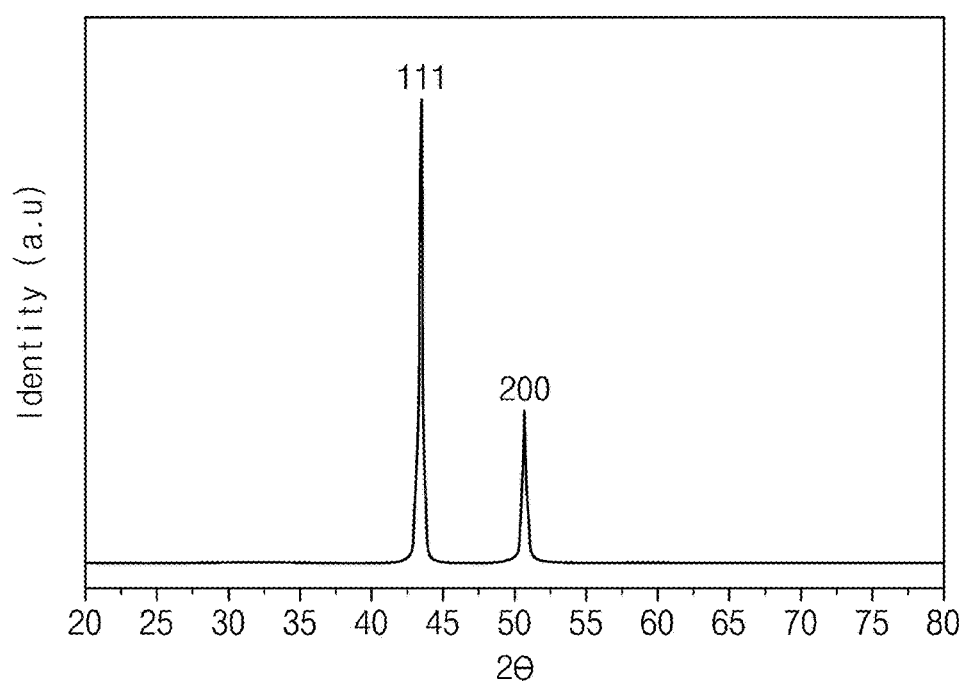
FIG. 8B shows XRD analysis results obtained from analyzing a crystal structure of a particle of an alloy included in a mask sheet after a process of heat treatment.

FIG. 8A shows XRD analysis results obtained from analyzing a crystal structure of a particle of an alloy included in a mask sheet before a process of heat treatment; and FIG. 8B shows XRD analysis results obtained from analyzing a crystal structure of a particle of an alloy included in a mask sheet after a process of heat treatment. Referring to FIGS. 6, 7, and 8A and 8B, the heat-treated base sheet HT-MO thermally treated by the process (S200) of performing the heat treatment has the modified crystal structure of the particle in the alloy.

Referring to FIGS. 8A and 8B, before the process (S200) of performing the heat treatment, XRD result shows a 111 peak and 110 peak. After the process (S200) of performing the heat treatment, the 111 peak increased, the 110 peak disappeared, and a 200 peak appeared. From this, it can be seen that the polycrystalline structure of the alloy in the base sheet MO has changed to include only the FCC structure.

Specifically, the particle of the alloy in the base sheet MO before the process (S200) of performing the heat treatment has the polycrystalline structure and, in an embodiment, includes both the FCC structure and the BCC structure. The particle of the alloy in the heat-treated base sheet HT-MO after the process (S200) of performing the heat treatment has the single crystalline structure and, particularly, includes only the FCC structure. As a result, the particle size of the alloy inside the heat-treated base sheet HT-MO is increased to micro-scale, and the thermal conductivity becomes increased, thereby resulting in the improvement of the welding characteristics.

The coefficient of thermal expansion in the base sheet MO before the process (S200) of performing the heat treatment may be about 3 ppm/° C. or more, for example, from about 5 ppm/° C. to about 8 ppm/° C. Meanwhile, the coefficient of thermal expansion in the heat-treated base sheet HT-MO may be about 1 ppm/° C. or less and, in an embodiment, from about 0.3 ppm/° C. to about 0.8 ppm/° C. The coefficient of thermal expansion is lowered by the process (S200) of performing the heat treatment, and, thus, in the subsequent process, i.e. in the process (S300) of forming the one or more openings OP, the laser drilling method may be easily carried out, and also the finally formed mask sheet MS may be used without deformation in the repeated deposition processes.

After the process (S200) of performing the heat treatment, the process (S300) of forming the one or more openings OP is carried out. In order to realize the high resolution, in an embodiment, the process is carried out by radiating a laser LZ in the process (S300) of forming the openings OP, unlike a typical etching method. When the laser LZ is radiated to form the openings OP, thicknesses of portions around the openings OP may become reduced when compared to those before the radiation of the laser LZ. In the method for manufacturing the mask sheet according to an embodiment of the present disclosure, the heat treatment is carried out before the openings OP are formed by the laser drilling method, and, thus, the coefficient of thermal expansion of the base sheet MO is reduced such that the vulnerability to heat due to the lowered thickness may be prevented or substantially prevented. That is, when the process (S200) of performing the heat treatment is carried out after the process (S300) of forming the openings OP, the base sheet may expand due to the low coefficient of thermal expansion in the region in which the openings OP are formed, and, thus, the openings OP may not be located at the desired position and may not have the desired shape.

A process of cutting the heat-treated base sheet HT-MO at a certain unit may be carried out after or before the process of forming the one or more openings OP, but embodiments of the present disclosure are not limited thereto. In this case, a plurality of divided mask sheets may be formed.

Figure 9A:
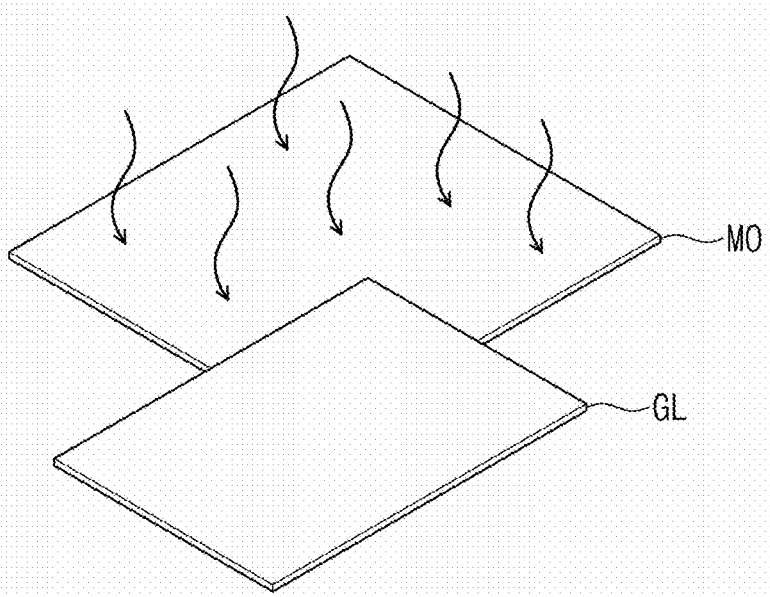
FIG. 9A is a view schematically showing a process in which only a portion of a base sheet is covered, and then heat treatment is performed under a nitrogen atmosphere.
Figure 9B:
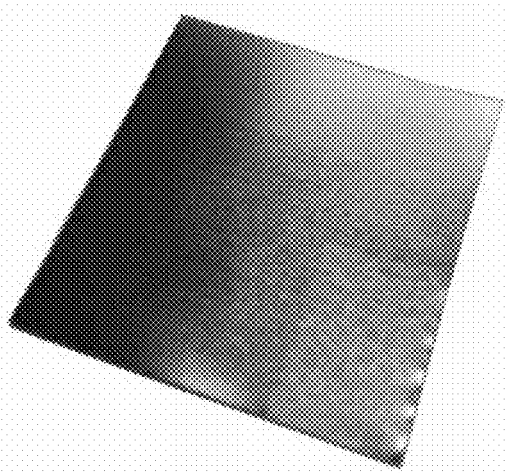
FIG. 9B is an image showing results according to FIG. 9A.

As previously described, the process (S200) of performing the heat treatment may be carried out under the nitrogen and hydrogen atmosphere. FIG. 9A is a view schematically showing a process in which only a portion of a base sheet is covered, and then heat treatment is performed under a nitrogen atmosphere. Particularly, FIG. 9A schematically illustrates a process in which only a portion of a base sheet MO is covered by a glass substrate GL, and then heat treatment is performed under a nitrogen atmosphere. FIG. 9B is an image showing results according to FIG. 9A. Referring to FIG. 9B, when the process (S200) of performing the heat treatment under the nitrogen atmosphere is carried out, it can be seen that oxidation and discoloration occur in the base sheet MO of FIG. 6. Therefore, in order to prevent or substantially prevent the oxidation reaction and discoloration, a small amount of hydrogen is used, and, in an embodiment, a ratio of the nitrogen and the hydrogen may be about 95:5 to about 99:1. In an embodiment, the ratio of the hydrogen to the total gas may be about 1% to about 5%, or about 1% to about 3%.

Figure 10:
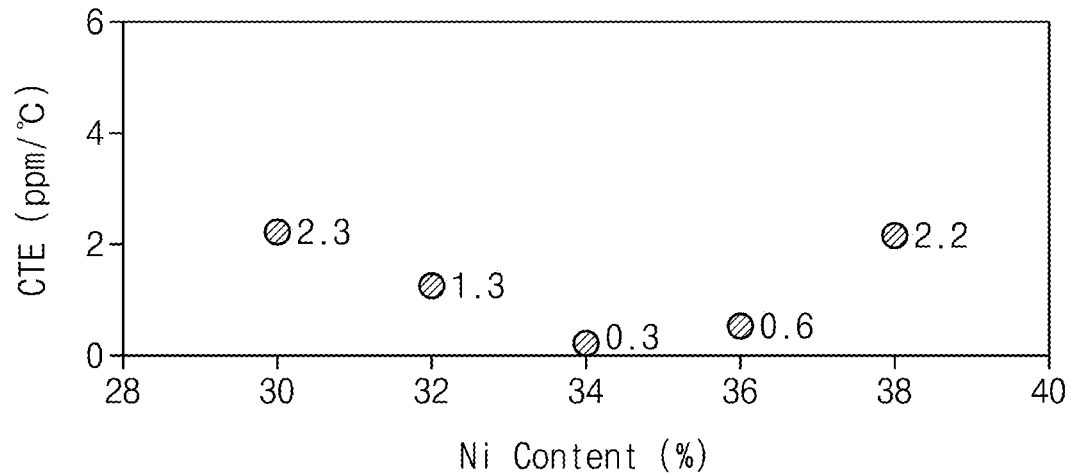
FIG. 10 is a graph obtained by analyzing a coefficient of thermal expansion after a heat treatment according to a content of nickel included in a base sheet.

FIG. 10 is a graph obtained by analyzing a coefficient of thermal expansion after a heat treatment according to a content of nickel included in a base sheet.

In an embodiment, the coefficient of thermal expansion of the base sheet MO of FIG. 6 after the heat treatment is about 1 ppm/° C. or less, and, referring to FIG. 10, a content of the nickel may be about 33 wt % to about 37 wt % in order to realize the desired coefficient of thermal expansion. In an embodiment, a content of the nickel in the alloy of nickel and iron may be about 36 wt %, but embodiments of the present disclosure are not limited thereto.

Figure 11:
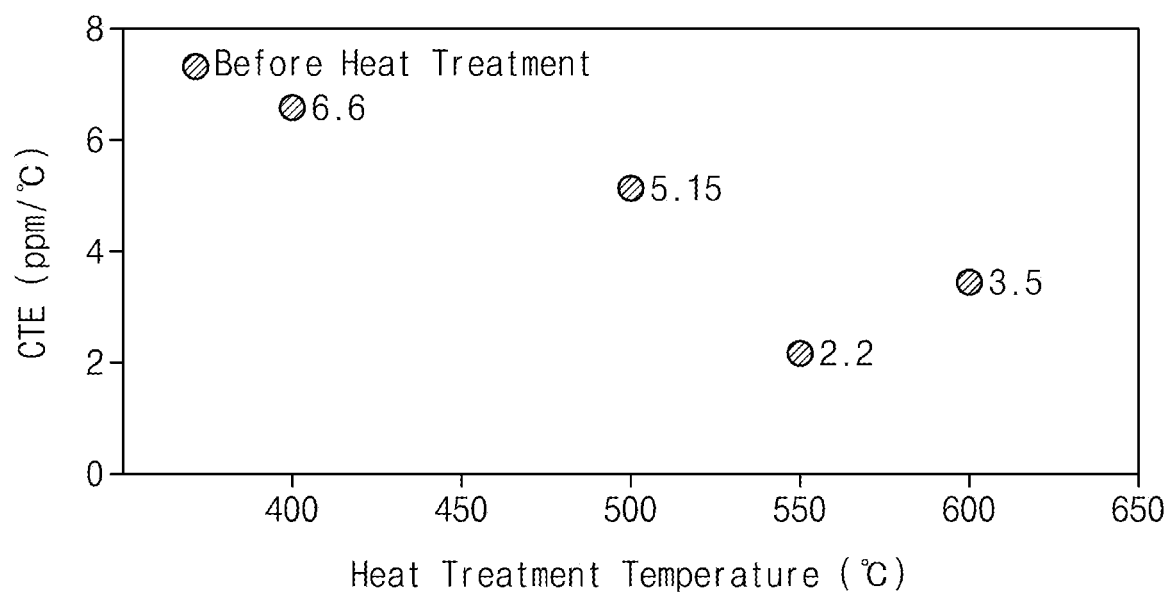
FIG. 11 is a graph obtained by analyzing a coefficient of thermal expansion according to a heat treatment temperature.

FIG. 11 is a graph obtained by analyzing a coefficient of thermal expansion according to a heat treatment temperature. More particularly, FIG. 11 shows the resulting values when a content of the nickel is about 40 wt %.

Referring to FIG. 11, in an embodiment, the process (S200) of performing the heat treatment in FIG. 5 may be carried out at a temperature in a range from about 520° C. to about 580° C. In an exemplary embodiment, the temperature of the heat treatment may be about 550° C., but embodiments of the present disclosure are not limited thereto.

From the resulting values of FIGS. 10 and 11, during the process (S200) of performing the heat treatment in FIG. 5, in an embodiment, the content of the nickel in the alloy of the base sheet MO of FIG. 6 is about 33 wt % to about 37 wt %, and the heat treatment temperature is about 520° C. to about 580° C., and, thus, the coefficient of thermal expansion of the heat-treated base sheet HT-MO of FIG. 7 may be reduced to about 1 ppm/° C. or less. In an exemplary embodiment, the content of the nickel is about 36 wt % and the heat treatment temperature is about 550° C., but the embodiments of the present disclosure are not limited thereto.

Referring back to FIG. 5, in an embodiment, the process (S200) of performing the heat treatment may be carried out for about one hour to about two hours. When carried out for less than one hour, there is little effect of heat treatment. On the other hand, when carried out for greater than two hours, it is disadvantageous in terms of the economic feasibility of the process because the degree of increase in heat treatment effect becomes reduced. Also, when exceeding two hours, an exterior deformation of the base sheet MO of FIG. 6 may occur. Considering the exterior deformation and the process economic feasibility, in an exemplary embodiment, the heat treatment time is about one hour, but the embodiments of the present disclosure are not limited thereto.

The base sheet having a thickness of about 20 μm and a nickel content of about 40 wt % was prepared, and then coefficient of thermal expansion was measured by varying a heat treatment temperature and a heat treatment time. Results are shown in Table 1 below.

TABLE 1

| Heat treatment temperature and Heat treatment time | First measurement of coefficient of thermal expansion (ppm/° C.) | Second measurement of coefficient of thermal expansion (ppm/° C.) | Average value |
|---|---|---|---|
| Not performed | 5.5 | 5 | 5.3 |
| 500° C., for 1 hour | 3.5 | 2.1 | 2.8 |
| 550° C., for 0.5 hour | 2.1 | 2.5 | 2.3 |
| 550° C., for 1 hour | 2.5 | 1.9 | 2.2 |
| 600° C., for 0.5 hour | 3.1 | 2.6 | 2.9 |
| 600° C., for 1 hour | 3.6 | 3.3 | 3.5 |

Referring to Table 1, it may be confirmed that, in an exemplary embodiment, the process (S200) of performing the heat treatment is carried out at a temperature in a range from about 520° C. to about 580° C. for about one hour or more.

The method for manufacturing the mask sheet according to an embodiment of the present disclosure may further include general processes that are well known to a person skilled in the art. For example, a process of cleaning to remove foreign substances and oxides may be conducted after the process (S300) of forming the one or more openings. Referring to FIG. 3, for another example, a process of welding and fixing the mask sheet MS to the mask frame MF may be conducted after the process (S300) of forming the one or more openings.

With the demands for high resolution in display devices, the thickness of the mask should be relatively reduced, but there is a technical limitation in forming a predetermined thickness or less by the typical rolling process. Therefore, research on manufacturing the mask sheet using the electroforming process has been conducted, but this process has not been commercialized because of welding failure caused by a higher coefficient of thermal expansion, smaller particle size, and the expansion of the mask due to the repeated usage, when compared to the rolling process.

Therefore, in the method for manufacturing the mask sheet according to an embodiment of the present disclosure, the base sheet MO is thermally treated prior to the formation of the openings OP, and this heat treatment increases the particle size of the base sheet MO, changes all crystal structures of the particle into the FCC structure to decrease the coefficient of thermal expansion, and increases the thermal conductivity to improve the welding characteristics and to solve the thermal expansion of the mask sheet MS. The mask sheet manufactured by the manufacturing method according to an embodiment of the present disclosure enables a deposition material to be deposited and thus forms a precise pattern and an accurate pattern, thereby enabling the manufacturing of high quality display devices with high resolution.

By using the mask sheet according to embodiments of the present disclosure, a light emitting layer of an organic electroluminescence display device may be formed to be a precise pattern, and, thus, the light emitting layer may be deposited and formed at an exact position, thereby enabling a precise image formation, but embodiments of the present disclosure are not limited thereto. More particularly, even though the deposition processes are repeatedly performed, a uniform pattern may be formed, thereby manufacturing the organic electroluminescence display device having the uniform quality, even in continuous production.

The mask sheet according to embodiments of the present disclosure enables the deposition material to be deposited, thereby forming a precise pattern and an accurate pattern.

The mask sheet, which is manufactured by the method for manufacturing the mask sheet according to embodiments of the present disclosure, enables the production of a display device having high resolution.

Although some embodiments of the present disclosure are described with reference to the accompanying drawings, it will be understood by those of ordinary skill in the technical field to which the present disclosure pertains that the present disclosure can be carried out in other forms without changing the technical idea or essential features. Therefore, the above-disclosed embodiments are to be considered illustrative and not restrictive.

What is claimed is:

1. A method for manufacturing a mask sheet, the method comprising:
   preparing a base sheet comprising an alloy of nickel and iron;
   performing a heat treatment on the entire base sheet; and
   forming one or more openings in the heat-treated base sheet,
   wherein the heat treatment is performed at a temperature in a range from about 520° C. to about 580° C. for about one hour to about two hours.

2. The method of claim 1, wherein the heat treatment is performed under a nitrogen and hydrogen atmosphere, and
   a ratio of the nitrogen and the hydrogen is about 95:5 to about 99:1.

3. The method of claim 1, wherein a content of the nickel in the alloy is in a range from about 33 wt % to about 37 wt %.

4. The method of claim 1, wherein the preparing the base sheet comprises forming the base sheet by electroforming.

5. The method of claim 1, wherein the forming the one or more openings is performed by laser radiation.

6. The method of claim 1, wherein the preparing the base sheet comprises preparing the base sheet having a thickness of about 30 µm or less.

7. The method of claim 1, wherein the preparing the base sheet comprises preparing the base sheet in which a crystal structure of the alloy comprises a polycrystalline structure.

8. The method of claim 1, wherein a crystal structure of the alloy in the heat-treated base sheet comprises a single crystalline structure.

9. The method of claim 8, wherein the single crystalline structure has only a face centered cubic structure.

10. The method of claim 1, wherein a size of crystal grains in a crystal structure in the heat-treated base sheet is in micro-scale.

* * * * *